United States Patent
Wu et al.

(10) Patent No.: US 6,180,467 B1
(45) Date of Patent: Jan. 30, 2001

(54) METHOD OF FABRICATING SHALLOW TRENCH ISOLATION

(75) Inventors: Kun-Lin Wu, Taichung; Horng-Bor Lu, Hsinchu, both of (TW)

(73) Assignee: United Microelectronics Corp., Hsinchu (TW)

(*) Notice: Under 35 U.S.C. 154(b), the term of this patent shall be extended for 0 days.

(21) Appl. No.: 09/211,641

(22) Filed: Dec. 15, 1998

(51) Int. Cl.[7] ............ H01L 21/336; H01L 21/76
(52) U.S. Cl. ............ 438/296; 438/424; 438/435
(58) Field of Search ............ 438/262, 437, 438/424, 296, 435, 221

(56) References Cited

U.S. PATENT DOCUMENTS

| | | | | |
|---|---|---|---|---|
| 5,447,884 | * | 9/1995 | Fahey et al. | 437/67 |
| 5,492,858 | * | 2/1996 | Bose et al. | 437/67 |
| 5,763,315 | * | 6/1998 | Benedict et al. | 438/424 |
| 5,837,612 | * | 11/1998 | Ajuria et al. | 438/697 |
| 5,940,717 | * | 8/1999 | Rengarajan et al. | 438/435 |
| 5,963,816 | * | 10/1999 | Wang et al. | 438/401 |
| 5,985,735 | * | 11/1999 | Moon et al. | 438/435 |
| 5,989,978 | * | 11/1999 | Peidous | 438/436 |

* cited by examiner

*Primary Examiner*—John F. Niebling
*Assistant Examiner*—Walter L. Lindsay, Jr.
(74) *Attorney, Agent, or Firm*—Thomas, Kayden, Horstemeyer & Risley

(57) ABSTRACT

A method for fabricating a shallow trench isolation in a semiconductor substrate. A mask layer is formed on the substrate. The mask layer is patterned and used as a mask in order to form a trench in the substrate. A portion of the substrate is removed to form the trench in the substrate. A liner layer is formed on the substrate exposed by the trench and optionally, an additonal liner layer is formed on the liner layer. A doped isolation layer is formed to fill the trench. A densification step is performed. The mask layer is removed. The doped isolation layer has a lower glass transition temperature so that the temperature of the densification step is reduced to about 700° C. to 1000° C.

20 Claims, 2 Drawing Sheets

METHOD OF FABRICATING SHALLOW TRENCH ISOLATION

BACKGROUND OF THE INVENTION

1. Field of the Invention

The present invention relates to a fabricating method of a semiconductor device. More particularly, the present invention relates to a method of forming an isolation region in a semiconductor substrate.

2. Description of the Related Art

An isolation region is formed in an integrated circuit for the purpose of separating neighboring device regions of a semiconductor substrate and preventing the carriers from penetrating through the substrate to neighboring devices. In a dynamic random access memory (DRAM) device, for example, the metal oxide semiconductor field effect transistors (MOSFETs) are isolated from each other by isolation regions in order to prevent current leakage among the MOSFETs. As the integration of the integrated circuit increases and the linewidth thereof decreases, it becomes desirable to use a shallow trench isolations (STI) in the integrated circuit.

A shallow trench isolation is commonly used in the manufacture of semiconductor device which is formed by anisotropically etching to form a trench in the substrate, depositing an isolation layer to fill the trench, performing a densification step, and then performing some follow-up steps to form an isolation region. In the above procedures for forming a shallow trench isolation, the densification step is performed with a temperature preferably higher than the glass transition temperature of the isolation layer in order to obtain a glass-like isolation layer which becomes flexible and rubber-like. In other words, the isolation layer becomes more compact after the densification step at a temperature higher than the glass transition temperature of the isolation layer. Additionally, in the densification step, the isolation layer releases the stress from the deposition step of forming the isolation layer.

In the conventional shallow trench isolation method, the isolation layer employed to fill the trench is a non-doped oxide. Since the glass transition temperature of the non-doped oxide layer is above approximately 1000° C. The temperature of the densification step, such as an annealing process, must be above about 900° C., and normally above about 1000° C. However, the high temperature of densification step easily damages specific wafers, such as epitaxial silicon wafers, and increases the thermal budget of the fabricating process.

SUMMARY OF THE INVENTION

It is an object of the present invention to provide a method of fabricating a shallow trench isolation in a semiconductor substrate, wherein the densification step is preformed at a lower temperature.

It is another object of the present invention to provide a method for fabricating a shallow trench isolation in a semiconductor substrate which reduces the thermal budget.

It is further another object of the present invention to provide a method for fabricating a shallow trench isolation in a semiconductor substrate which reduces damage to wafers in a thermal step.

To achieve these and other advantages and in accordance with the purpose of the present invention, as embodied and broadly described herein, this invention provides a method of fabricating a shallow trench isolation in a semiconductor substrate. The method includes formation of a mask layer on a substrate. The mask layer is patterned and used as a mask. A portion of the substrate is removed to form the trench in the substrate. A liner layer is formed on the substrate exposed by the trench and optionally, an additional liner layer is formed on the liner layer. A doped isolation layer is formed to fill the trench. A densification step is performed. The mask layer is removed. Since the doped isolation layer has a lower glass transition temperature than that of non-doped isolation employed in the conventional STI method, the temperature of the densification step in the present method is lowered. Therefore, the thermal budget of the fabricating process and the chance of wafer damages are reduced.

In a preferred embodiment of the present invention, the material of the doped isolation layer preferably is an oxide doped with boron (B), phosphorus (P), germanium (Ge), or the combination thereof, or the likes. Preferably, the material of the doped isolation layer is one selected from the group consisting of silicon glass (BSG), phosphate silicon glass (PSG), germanium silicon glass (GeSG), or the combinations thereof, or the like. The glass transition temperature of the doped isolation layer, such as doped oxide layer, is lower than that of the conventional non-doped oxide layer. Therefore, the temperature of the densification step according to the preferred embodiment of this invention is lower than that of the conventional densification step, which is about 700° C. to 1000°C.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the invention. In the drawings.

DESCRIPTION OF THE PREFERRED EMBODIMENTS

Figure 1A:
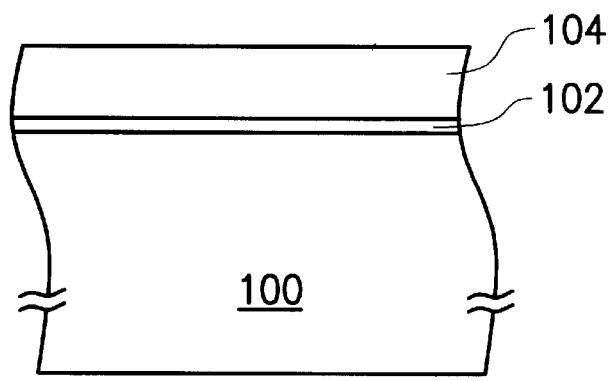
FIGS. 1A through 1E are schematic, cross-sectional views showing, a method of fabricating, a shallow trench isolation according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

As shown in FIG. 1A, a pad oxide layer 102 is formed on a substrate 100. The substrate 100 can be a semiconductor substrate, such as a P-type silicon substrate, for example. The pad oxide layer 102 is used to protect the substrate 100. The pad oxide layer 102 can be formed by thermal oxidation, for example. The pad oxide layer 102 preferably has a thickness of 50 Å (angstrom) to 500 Å. A mask layer 104 is formed on the pad oxide layer 102. The material of the mask layer 104 preferably is silicon nitride.

Figure 1B:
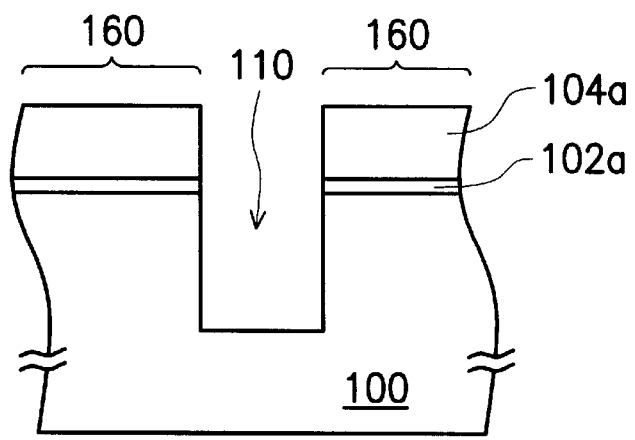

In FIG. 1B, a patterned photoresist layer (not shown) is formed over the mask layer 104. An etching process is performed by anisotropic etching. The mask layer 104 is patterned to leave a mask layer 104a. The pad oxide layer 102 and the substrate 100 are etched to form a patterned pad oxide layer 102a and a trench 110 in the substrate 100. The substrate 100 is patterned to define active regions 160 of the substrate 100. The photoresist layer is removed.

Figure 1C:
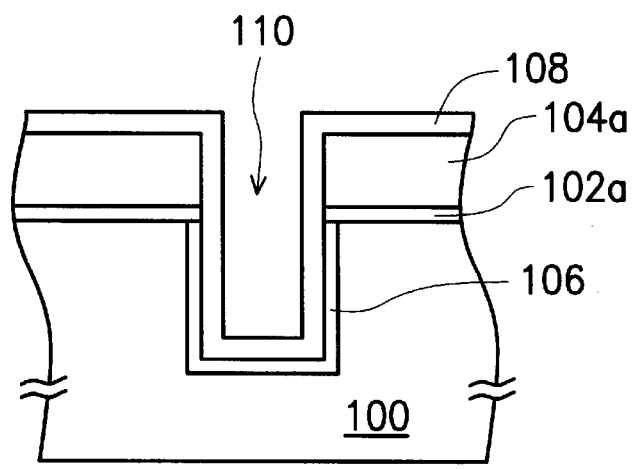

In FIG. 1C, a first liner layer 106 is formed on the substrate 100 exposed by the trench 110 and to the side of pad oxide layer 102a. The first liner layer 106 preferably is a liner oxide layer. The liner layer 106 can be formed by thermal oxidation, for example. Preferably, the liner layer 106 has a thickness of about 100 Å to 600 Å. An additional second liner layer 108 is formed over the contour of the substrate 100 and covered the liner layer 106 in the trench. The additional second liner layer 108 is used as a barrier layer to prevent the dopant of the doped oxide layer for filling the trench, which is formed in the subsequent step, from diffusing into active regions. The material of the second liner layer 108 is preferably silicon oxide or silicon-oxy-nitride, for example. The preferred thickness of the second liner layer 108 is about 100 Å to 1000 Å. The second liner layer 108 can be formed by low pressure chemical vapor deposition (LPCVD), plasma-enhanced chemical vapor deposition (PECVD), or high-density plasma chemical vapor deposition (HDPCVD), for example.

Figure 1D:
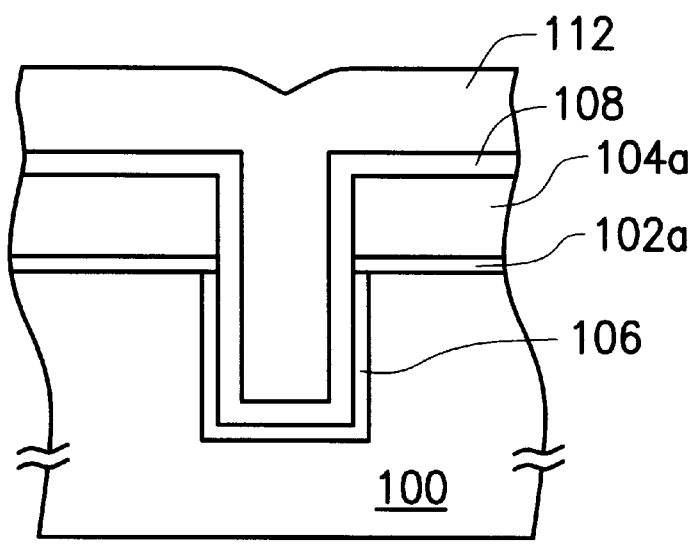

In FIG. 1D, a doped isolation layer 112 is formed over the contour of the substrate 100 and fills the trench 110. The material of doped isolation layer 112 preferably is an oxide doped with boron (B), phosphorus (P), germanium (Ge), the combination thereof, or the likes. Preferably, the material of the doped isolation layer 112 is selected from the group consisting of boron silicon glass (BSG), phosphate silicon glass (PSG). germanium silicon glass (GeSG), or the combinations thereof, or the like. The doped isolation layer 112 can be formed by atmospheric pressure chemical vapor deposition (APCVDS), sub-atmospheric pressure chemical vapor deposition (SACVD), or high-density plasma chemical vapor deposition (HDPCVD), for example.

The glass transition temperature and the doping concentration have an inverse relationship. That is, the glass transition temperature of doped isolation layer reduces as doping concentration increases. For example, when the doping concentration of a GeSG layer is about 0.1% to 10%, the glass transition temperature thereof is about 500° C. to 730° C. In contrast with the non-doped GeSG layer, the doped GeSG layer has a lower glass transition temperature, and thus the required temperature for the following densification step can be lowered.

The following densification step can be performed by rapid thermal process (RTP) or furnace annealing process, for example. In the preferred embodiment, the temperature of the densification step is about 700° C. to 1000° C. The temperature of the densification step according to the preferred embodiment of the present invention is lower than that of the conventional densification step, which has a temperature above 1000° C. The thermal budget of the fabricating process of the present invention thus is reduced. The glass transition temperature of the doped isolation layer 112 is lower than that of the conventional non-doped isolation layer. Therefore the densification step can be performed at a temperature which is higher than the glass transition temperature of the doped isolation layer 112 but lower than the temperature required in the conventional densification step, in consider for the limitation of the thermal budget. Furthermore, the stress arising from deposition of the doped isolation layer 112 can be effectively released.

Figure 1E:
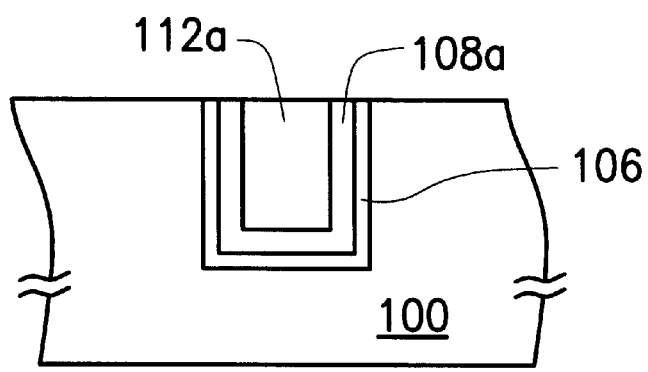

In FIG. 1E, a portion of the doped isolation layer 112 is removed by chemical-mechanical polishing until the second liner layer 108 of the active region 160 is exposed. A portion of the second liner layer 108 is removed. The mask layer 104a and the pad oxide layer 102a are removed. A portion of the isolation layer 112 is removed while removing the pad oxide layer 102a. The second liner layer 108a, which remains from the liner layer 108, and the isolation layer 112a, which remains from the isolation layer 112, are formed.

In summary the invention has the following advantages:
1. The method of the present invention employs a doped isolation layer to fill the trench so that the temperature of the densification step is lowered, which reduces the thermal budget for the fabricating process.
2. The method of the present invention forms an additional liner layer on a liner layer, which is formed on the substrate exposed by the trench, in order to prevent the dopant in the doped isolation layer of the isolation region from diffusing into the active regions.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of a shallow trench isolation, comprising the steps of:
   forming a mask layer on a substrate, wherein the mask layer and the substrate is patterned to form a trench in the substrate;
   forming a first liner layer on the substrate exposed by the trench;
   forming a second liner layer on the first liner layer and the mask layer;
   forming a doped isolation layer formed by high-density plasma chemical vapor deposition to fill the trench;
   performing a densification step at a temperature of about 700° C. to 800° C.; and
   removing the mask layer.

2. The method of claim 1, wherein the first liner layer comprises a liner oxide layer.

3. The method of claim 1, wherein the step of forming the first liner layer is performed by thermal oxidation.

4. The method of claim 1, wherein the first liner layer has a thickness of about 100 Å to 1000 Å.

5. The method of claim 1, wherein the material of the second liner layer is one selected from the group consisting of silicon nitride, silicon-oxy-nitride and the likes.

6. The method of claim 1, wherein the second liner layer has a thickness of about 100 Å to 1000 Å.

7. The method of claim 1, wherein the material of the isolation layer is one selected from the group consisting of boron silicon glass, phosphate silicon glass, germanium silicon glass and the likes.

8. A method of a shallow trench isolation, wherein the method is suitable for a substrate in which a trench is formed, comprising the steps of:
   forming a first liner layer on the substrate exposed by the trench;
   forming a second liner layer on the first liner layer and the mask layer;
   forming an isolation layer to fill the trench, wherein the isolation layer is doped by dopant and formed by atmospheric pressure chemical vapor deposition; and performing a densification step at a temperature of about 700° C. to 800° C.

9. The method of claim 8, wherein the first liner layer comprises a liner oxide layer.

10. The method of claim 8, wherein the material of the second liner layer is one selected from the group consisting of silicon nitride, silicon-oxy-nitride, and the likes.

11. The method of claim 8, wherein the second liner layer has a thickness of about 100 Å to 1000 Å.

12. The method of claim 8, wherein the dopant is one selected from boron, phosphorus, germanium, the combination thereof, and the likes.

13. The method of claim 4, wherein the material of the second liner layer is formed by chemical vapor deposition.

14. The method of claim 10, wherein the material of the second liner layer is formed by chemical vapor deposition.

15. A method of a shallow trench isolation, comprising the steps of:

forming a mask layer on a substrate, wherein the mask layer and the substrate are patterned to form a trench in the substrate;

forming a first liner layer on the substrate exposed by the trench;

forming a second liner layer on the first liner layer and the mask layer;

forming a doped isolation layer by sub-atmospheric pressure chemical vapor deposition to fill the trench;

performing a densification step at a temperature of about 700° C. to 800° C.; and removing the mask layer.

16. The method of claim 15, wherein the first liner layer comprises a liner oxide layer.

17. The method of claim 15, wherein the material of the second liner layer is one selected from the group consisting of silicon nitride, silicon-oxy-nitride, and the likes.

18. The method of claim 15, wherein the material of the second liner layer is formed by chemical vapor deposition.

19. The method of claim 15, wherein the second liner layer has a thickness of about 100 Å to 1000 Å.

20. The method of claim 15, wherein the material of the isolation layer is one selected from the group consisting of boron silicon glass, phosphate silicon glass, germanium silicon glass and the likes.

* * * * *